United States Patent

Haselden et al.

[19]

[11] Patent Number: 6,121,154
[45] Date of Patent: *Sep. 19, 2000

[54] TECHNIQUES FOR ETCHING WITH A PHOTORESIST MASK

[75] Inventors: Barbara Haselden, Cupertino; John Lee; Chau Arima, both of Fremont; Eddie Chiu, Pleasanton, all of Calif.

[73] Assignee: Lam Research Corporation, Fremont, Calif.

[*] Notice: This patent issued on a continued prosecution application filed under 37 CFR 1.53(d), and is subject to the twenty year patent term provisions of 35 U.S.C. 154(a)(2).

[21] Appl. No.: 08/997,346

[22] Filed: Dec. 23, 1997

[51] Int. Cl.$^7$ .............................................. H01L 21/3065
[52] U.S. Cl. ........................... 438/724; 438/725; 216/46; 216/49; 430/317
[58] Field of Search ................................ 438/724, 725; 216/46, 49; 430/313, 314, 323, 325, 317

[56] References Cited

U.S. PATENT DOCUMENTS

| | | | |
|---|---|---|---|
| 4,613,400 | 9/1986 | Tam et al. | 216/46 |
| 4,713,141 | 12/1987 | Tsang | 438/695 |
| 4,844,773 | 7/1989 | Lowenstein et al. | 438/711 |
| 5,275,692 | 1/1994 | Barkanic | 438/694 |
| 5,332,653 | 7/1994 | Cullen et al. | 430/323 |
| 5,520,770 | 5/1996 | Namose | 438/696 |
| 5,695,602 | 12/1997 | Takeshiro | 438/703 |
| 5,726,102 | 3/1998 | Lo | 438/718 |

FOREIGN PATENT DOCUMENTS

| | | | |
|---|---|---|---|
| 0202907A2 | 11/1986 | European Pat. Off. | G03F 7/26 |
| 02309633 | 12/1990 | Japan | H01L 21/302 |
| 05259269 | 10/1993 | Japan | H01L 21/76 |

OTHER PUBLICATIONS

International Search Report, EPO, Apr. 16, 1999.

*Primary Examiner*—Benjamin L. Utech
*Assistant Examiner*—Donald L. Champagne
*Attorney, Agent, or Firm*—Beyer Weaver & Thomas, LLP

[57] ABSTRACT

A method for improving profile control during an etch of a nitride layer disposed above a silicon substrate is disclosed. The nitride layer 106 is disposed below a photoresist mask 108A. The method includes positioning the substrate, including the nitride layer and the photoresist mask, in a plasma processing chamber. There is also included flowing a chlorine-containing etchant source gas into the plasma processing chamber. Further, there is included igniting a plasma out of the chlorine-containing etchant source gas to form a chlorine-based plasma within the plasma processing chamber. Additionally, there is included treating, using a chlorine-based plasma, the photoresist mask in the plasma processing chamber. The treatment of the photoresist is configured to etch at least a portion of the photoresist mask and to deposit passivation polymer on vertical sidewalls of the photoresist mask without etching through the nitride layer.

19 Claims, 5 Drawing Sheets

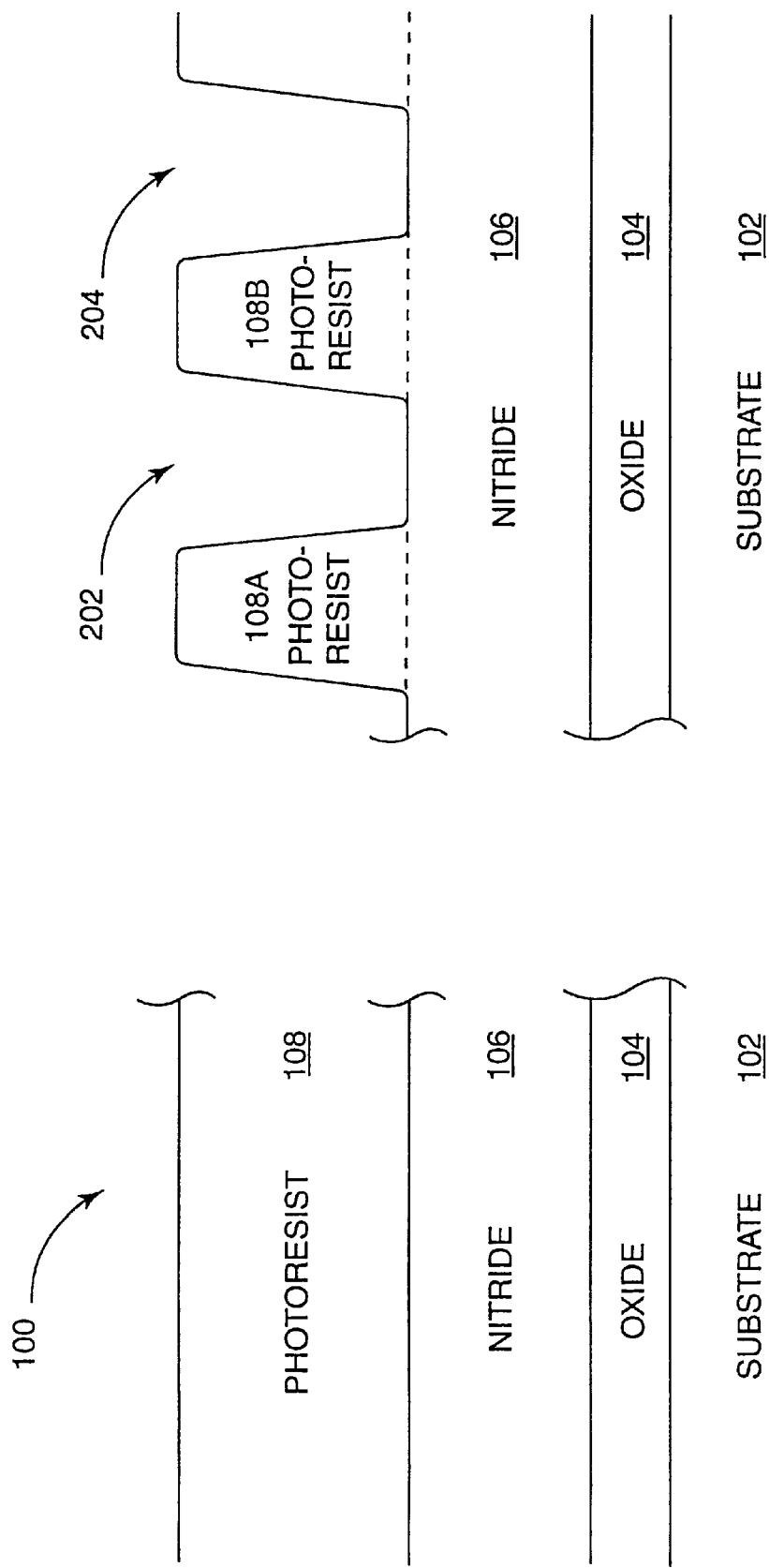

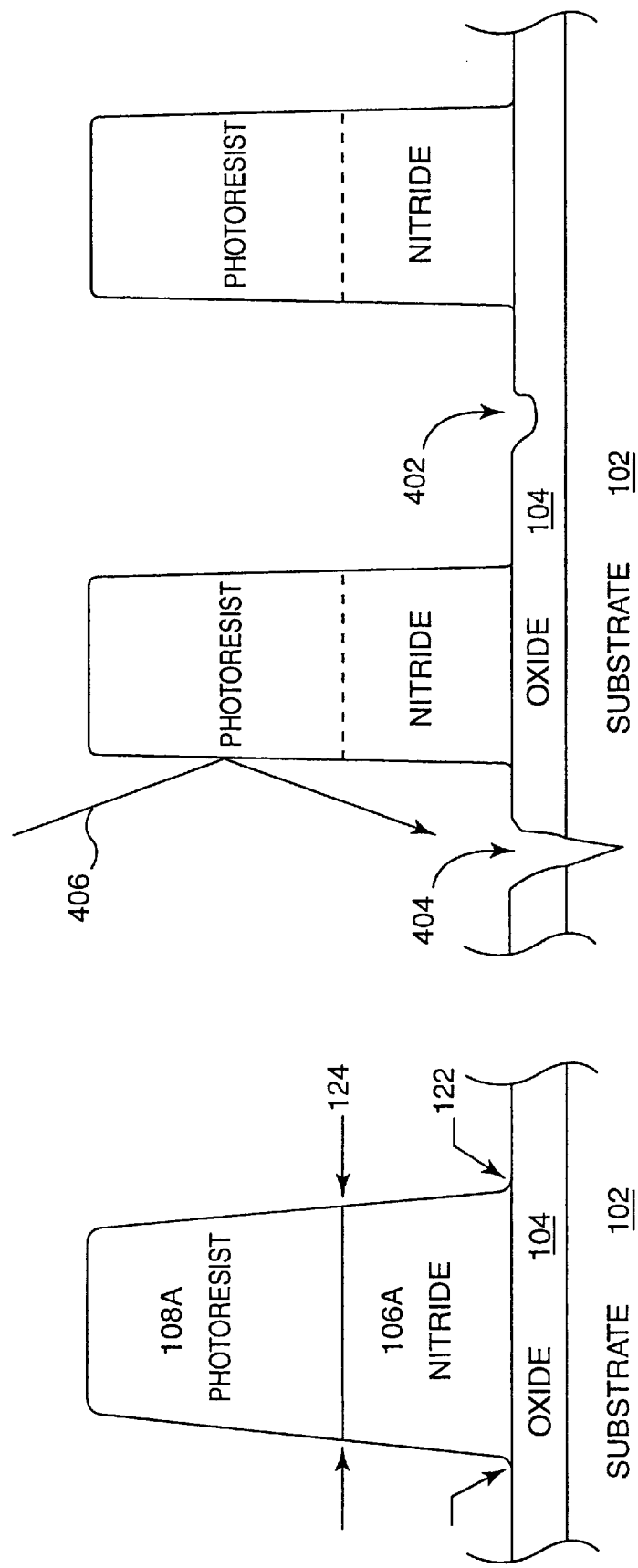

TECHNIQUES FOR ETCHING WITH A PHOTORESIST MASK

BACKGROUND OF THE INVENTION

The present invention relates to the manufacture of semiconductor-based devices. More particularly, the present invention relates to techniques for improving the etching of layers underlying a photoresist mask during manufacturing.

During the manufacture of semiconductor-based devices, i.e., electronic devices employing a semiconductor material, various layers may be deposited on a substrate and selectively etched to form the desired devices. To selectively etch a given layer, a photoresist mask is typically employed.

To facilitate discussion, FIG. 1 illustrates an exemplary layer stack 100, including a plurality of layers disposed on a substrate 102. Substrate 102 may take the form of, for example, a wafer or a glass panel, out of which integrated circuits or flat panel displays may be fabricated. The exemplary layer stack shown in FIG. 1 includes an oxide ($SiO_2$) layer 104 disposed above substrate 102. Oxide layer 104 is typically formed using a suitable oxide formation process such as thermal oxidation (e.g., either wet or dry oxidation). A nitride ($Si_xN_y$, such as $Si_3N_4$) layer 106 is shown disposed above oxide layer 104 and is typically formed using a suitable nitride process such as low pressure chemical vapor deposition (LPCVD). Layer stack 100 may be employed to form, for example, the active area of an integrated circuit.

To facilitate the selective etching of nitride layer 106, a photoresist layer 108 is first deposited by, for example, a spin-on process. Thereafter, a conventional photolithography process is employed to pattern photoresist layer 108 to form a mask to facilitate subsequent etching of selective regions in nitride layer 106. By way of example, one such technique involves the patterning of photoresist layer 108 by exposing the photoresist material in a contact or stepper lithography system, and the development of the photoresist material to form a mask to facilitate subsequent etching. The photoresist mask formed is depicted in FIG. 2. Thereafter, areas of the photoresist-underlying layer that is unprotected by the mask (e.g., areas 202 and 204 of nitride layer 106) are then etched away, leaving behind the desired features.

As the density of electronic devices increases, the accuracy of the etching process becomes more critical. This is because when devices are packed closely together, the etch profile must be carefully controlled to prevent, for example, inadvertent electrical shorts among adjacent features. When the device size reaches the submicron ranges, e.g., 0.25 micron or below, it has been observed that conventional photoresist masks, at times, cause difficulties in the subsequent etch process.

To facilitate discussion of the problems encountered when the prior art photoresist mask is employed, without modification, to etch the photoresist-underlying layer (e.g., nitride layer 106), FIG. 3 illustrates a portion of nitride layer 106 of FIG. 2 after etching. In FIG. 3, there is shown a photoresist feature 108(a), representing for example one of the photoresist features of FIG. 2. A nitride feature 106(a) is also shown, representing the nitride material remaining after the nitride etch step.

As shown in FIG. 3, photoresist feature 108(a) exhibits a tapered profile, i.e., the angle formed by the vertical photoresist sidewall with the substrate plane is less than perpendicular. The tapered profile of the photoresist feature, which may be due to the photolithography step that patterns photoresist layer 108 and/or the isotropic component of the subsequent nitride etch, propagates downward through the nitride layer as the nitride etch proceeds. Accordingly, nitride feature 106(a) also assumes a tapered profile, with the dimension at the bottom of the nitride feature (122) being somewhat wider than that at the top (124).

The tapered profile of nitride feature 106(a) represents relatively poor control of the profile of the etched feature. The lack of profile control renders it difficult to control the critical dimension (CD) of the resultant nitride features. If the lack of profile control and/or CD control is particularly severe, the resultant etch features may be unsuitable for use in fabricating modern high density (e.g., submicron or below) devices.

It has been suggested that the etch profile may be improved by increasing the ion bombardment, or physical etch, component of the nitride etch. In a parallel plate plasma system, increasing ion bombardment may be accomplished by, for example, increasing the RF power setting, decreasing the etch pressure, reducing the gap between the parallel plates of the plasma processing chamber (or any combination of the above). While increasing ion bombardment may result in a more vertical etch sidewall, such an approach also has its drawbacks.

By way of example, ion bombardment, being a physical process, is not particularly selective among the different layers. Accordingly, it tends to indiscriminately etch all layers, including layers through which etching is undesired. Further, it is relatively difficult to precisely control the ion bombardment process. Accordingly, increasing the ion bombardment component of the etch may cause unintended damage to other layers and/or other features of the substrate. With reference to FIG. 4, for example, increasing the ion bombardment component may undesirably cause damage to underlying oxide layer 104 (in region 402) and/or substrate 102 (in region 404).

In view of the foregoing, there are desired techniques for improving the etch of layers underlying a photoresist layer during the manufacture of semiconductor-based devices.

SUMMARY OF THE INVENTION

The present invention relates, in one embodiment, to a method for etching a photoresist-underlying layer. The method includes providing a substrate having thereon a photoresist-underlying layer and a photoresist mask overlying the photoresist-underlying layer. The method further includes treating, using a chlorine-based plasma, the photoresist mask in a plasma processing chamber. The treating is configured to etch at least a portion of the photoresist mask and to deposit passivation polymer on vertical sidewalls of the photoresist mask. The method further includes etching, after the treating, the photoresist-underlying layer in a subsequent etching process using the photoresist mask.

In another embodiment, the invention relates to a method for improving profile control of during an etch of a photoresist-underlying layer disposed above a substrate. The photoresist-underlying layer is disposed below a photoresist mask. The method includes positioning the substrate, including the photoresist-underlying layer and the photoresist mask, in a plasma processing chamber. There is also included flowing a chlorine-containing etchant source gas into the plasma processing chamber. Additionally, there is included igniting a plasma out of the chlorine-containing etchant source gas to form a chlorine-based plasma within the plasma processing chamber. Further, there is included treating, using a chlorine-based plasma, the photoresist mask in the plasma processing chamber. The treatment of the photoresist is configured to etch at least a portion of the photoresist mask and to deposit passivation polymer on vertical sidewalls of the photoresist mask without etching through the photoresist-underlying layer.

In yet another embodiment, the invention relates to a method for improving profile control of during an etch of a nitride layer disposed above a silicon substrate. The nitride layer is disposed below a photoresist mask. The method includes positioning the substrate, including the nitride layer and the photoresist mask, in a plasma processing chamber. There is also included flowing a chlorine-containing etchant source gas into the plasma processing chamber. Further, there is included igniting a plasma out of the chlorine-containing etchant source gas to form a chlorine-based plasma within the plasma processing chamber. Additionally, there is included treating, using a chlorine-based plasma, the photoresist mask in the plasma processing chamber. The treatment of the photoresist is configured to etch at least a portion of the photoresist mask and to deposit passivation polymer on vertical sidewalls of the photoresist mask without etching through the nitride layer.

These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which:

FIG. 1 illustrates an exemplary layer stack, including a plurality of layers disposed on a substrate to facilitate discussion.

FIG. 2 illustrates the layer stack of FIG. 1, including the photoresist layer after being patterned using a prior art photolithography process.

FIG. 3 illustrates a portion of the nitride layer of FIG. 2 after nitride etching.

FIG. 4 shows the damage to the underlying oxide layer or the underlying substrate when the ion bombardment component of the nitride etch is increased to achieve improved profile control and/or critical dimension control.

DETAILED DESCRIPTION OF THE PREFERRED EMBODIMENTS

Figure 5:
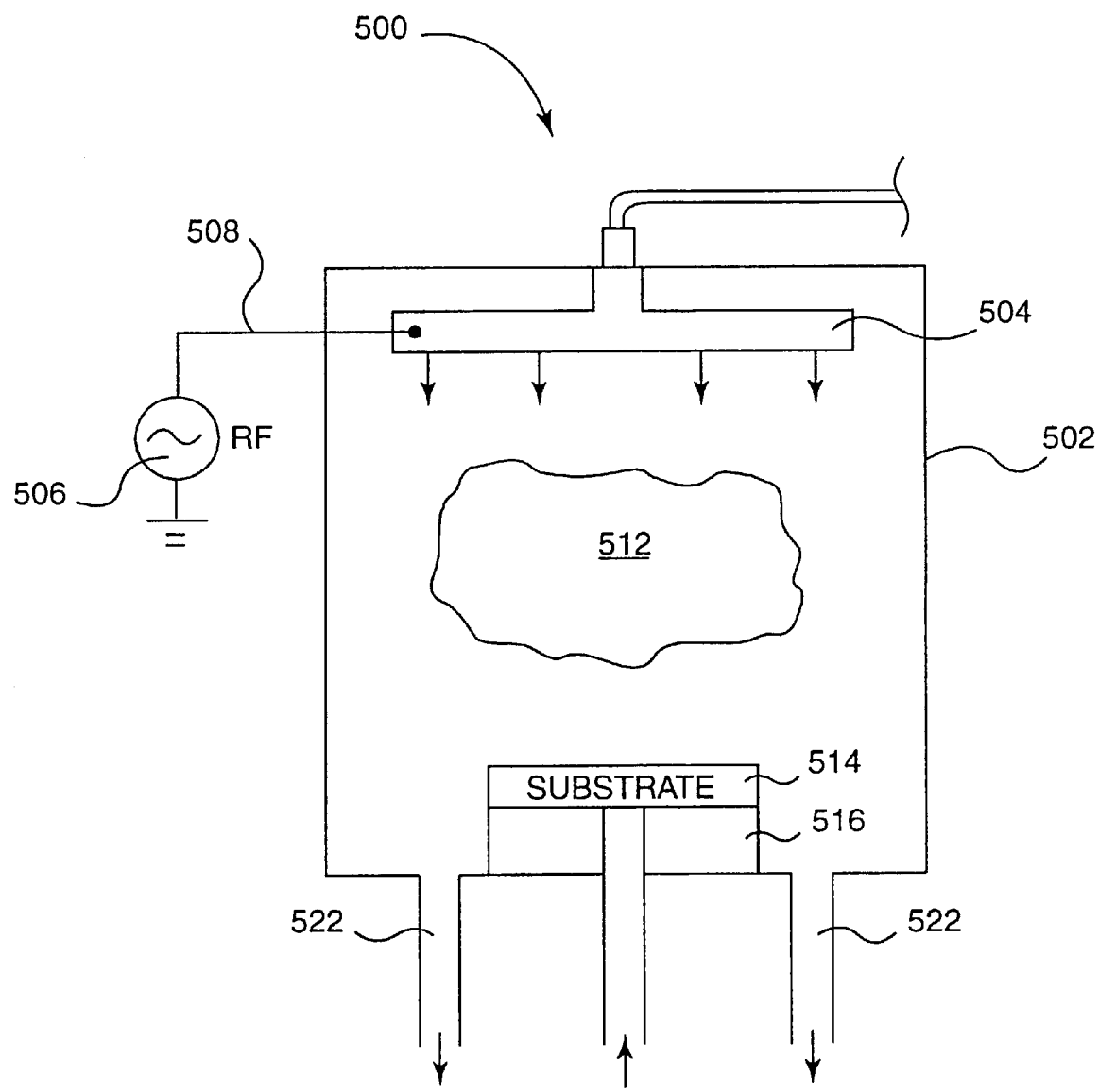
FIG. 5 depicts an exemplary parallel plate plasma processing system, representing a plasma processing system suitable for use with the inventive photoresist plasma pretreatment process.

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

In accordance with one aspect of the present invention, the etch profile of the photoresist-underlying layer (e.g., the nitride layer in the example herein) is improved by plasma treatment of the photoresist mask in advance of the photoresist-underlying layer etch. As the term is employed herein, the photoresist-underlying layer represents one or more layers underlying the photoresist mask and configured to be subsequently etched using that photoresist mask. It should also be kept in mind that the layers shown in the figures herein are illustrative only and different layers may be present in different layer stacks to be etched using the treated photoresist mask. Further, one or more other layers may be present in between the shown layers. Such layers may include, for example, an adhesion promotion layer, a seed layer, or any other layer. Accordingly, positional terms such as "above," "overlying," "below," and "underlying" as employed herein do not necessarily require a direct contact between the layers.

In one embodiment, the plasma photoresist pretreatment is configured to reduce the taper of the photoresist features by depositing passivation polymer along the vertical surfaces of the photoresist features. By improving the profile of the photoresist features prior to etching the photoresist-underlying layer, the profile of the features etched out of the photoresist-underlying layer is improved.

Alternatively or additionally, the passivation polymer on the vertical sidewalls of the photoresist features helps maintain the profile of the photoresist features during the photoresist-underlying layer etch, thereby helping to improve control of the profile of the features subsequently etched out of the photoresist-underlying layer. With the improved technique, control of the profile of the features etched out of the photoresist-underlying layer is advantageously achieved without requiring a high ion bombardment etch. Without a high physical etch component, unintended damage to other layers and/or regions of the substrate is advantageously minimized when etching the photoresist-underlying layer.

The features and advantages of the present invention may be more clearly appreciated with reference to the figures that follow. In accordance with one aspect of the present invention, the substrate having thereon a photoresist-underlying layer (e.g., nitride layer 106 of FIG. 2) and a photoresist mask (e.g., photoresist mask 108 of FIG. 2) is first processed in a plasma environment to treat the photoresist mask prior to the photoresist-underlying layer etch. The photoresist plasma pretreatment is a separate process from the process employed to etch the photoresist-underlying layer in that it employs a different plasma for treating the photoresist mask prior to the actual photoresist-underlying layer etch. Although some of the material of the photoresist-underlying layer may be etched during this photoresist plasma pretreatment process, the photoresist plasma pretreatment preferably (but not necessarily) etches through the photoresist-underlying layer (e.g., the nitride layer) at a slower rate than the rate of the subsequent etch process employed to actually etch through the photoresist-underlying layer.

In one embodiment, both the photoresist plasma pretreatment and the photoresist-underlying layer etch may be performed in a single plasma processing chamber (in two different steps) if desired. In fact, both the photoresist plasma pretreatment and the photoresist-underlying layer etch may be performed in the same plasma processing chamber even without breaking vacuum lock. However, it is contemplated that the photoresist plasma pretreatment may also be performed in a plasma processing chamber that is different from the processing chamber employed for the photoresist-underlying layer etch.

In one embodiment, the photoresist plasma pretreatment is performed in a parallel plate plasma processing system known as the 4420XL™ by Lam Research Corp. of Fremont, Calif. It is contemplated, however, that other suitable plasma processing systems, such as any of the suitable high density, low pressure plasma systems (including capacitively coupled, inductively coupled, electron cyclotron resonance (ECR) systems) may well be employed. Pretreatment may also be performed in, for example, suitable diode or triode-based systems. Accordingly, it should be kept in mind that although the 4420XL™ is depicted herein to facilitate discussion, the inventive photoresist plasma pretreatment (and/or the subsequent photoresist-underlying layer etch) may be performed using any suitable plasma processing system.

Referring now to FIG. 5, a plasma processing system 500 includes a plasma processing chamber 502. Above chamber 502, there is disposed an electrode 504, which is implemented by a gas dispensing apparatus having a shower head configuration in the example of FIG. 5. Electrode 504 is energized by a radio frequency (RF) generator 506 via a matching network 508. In the example of FIG. 5, RF generator 506 sources RF energy having a frequency of about 13.56 MHz although other appropriate frequencies may also be employed.

Shower head 504 represents the gas distribution apparatus for releasing the gaseous etchant source gas into the RF-induced plasma region 512 between itself and a substrate 514. However, other gas distribution apparatus such as gas distribution rings or simply ports disposed in the chamber walls may also be employed. Substrate 514 having thereon a photoresist-underlying layer disposed below a photoresist mask is introduced into plasma processing chamber 502 and disposed on a chuck 516. In the example of FIG. 5, chuck 516 represents an electrostatic chuck (ESC) although chuck 516 may represent, for example, a vacuum chuck, a mechanical chuck, or simply a workpiece holder.

A heat exchange gas such as helium may be introduced into the region in between chuck 516 and substrate 514 to control the heat transfer between the substrate and the chuck to ensure uniform and repeatable process results. To facilitate photoresist plasma pretreatment (or the subsequent etch of the photoresist-underlying layer), an appropriate etchant source gas is flowed through shower head 504 and ignited by the RF energy supplied by RF generator 506. During photoresist plasma pretreatment (or during the subsequent etch), some of the formed byproduct gases is exhausted out of chamber 502 through exhaust port 522 (e.g., using an appropriate turbo pump arrangement). In the example of FIG. 5, exhaust port 522 has a ring-like configuration and is disposed at the bottom of the chamber although any other suitable configuration may be employed. Although not absolutely required, the gap between electrode 502 and substrate 514 may be varied (e.g., by moving the electrode and/or the substrate) to permit process optimization.

In one embodiment, plasma treatment of the photoresist mask is performed using a chlorine-based plasma. The chlorine-based plasma may be formed from a suitable etchant source gas that includes a chlorine-containing gas (e.g., $Cl_2$). Additive gases such as HBr, Oxygen, Nitrogen and/or He may also be added (e.g., to the $Cl_2$ gas).

Figure 6:
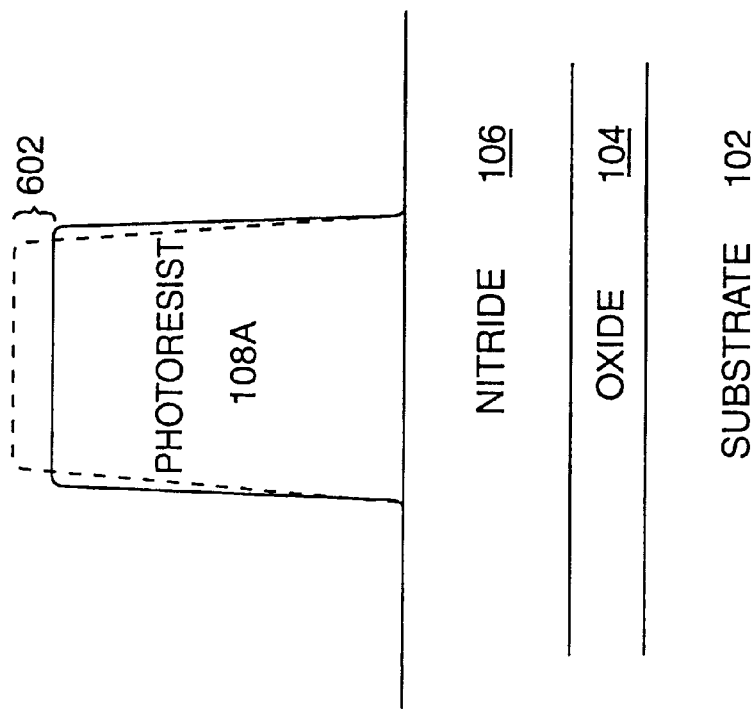
FIG. 6 illustrates the layer stack of FIG. 2 after the photoresist mask is pretreated with plasma in accordance with one aspect of the present invention.

The chlorine-based plasma is configured to etch down part of the photoresist features. During the photoresist plasma pretreatment, passivation polymer is deposited along the vertical sidewalls of the photoresist features. With reference to FIG. 6, the photoresist plasma pretreatment etches away portion 602 of photoresist feature 108(a) and deposit passivation polymer along the vertical surfaces of the photoresist feature. For ease of understanding, the photoresist feature before treatment is represented by dashed lines in FIG. 6 while the photoresist feature after plasma pretreatment is represented by solid lines. It is believed that the deposition of the passivation polymer helps reduce the taper of the photoresist feature, thereby improving the profile of the photoresist feature. As mentioned earlier, this improved profile is transferred or propagated down into the features etched out of the photoresist-underlying layer.

Some of the exposed material in the photoresist-underlying layer may also be etched during the plasma treatment of the photoresist as well. For example, a few hundred angstroms of the nitride material may be etched away during an exemplary photoresist plasma pretreatment. However, it is preferably that the photoresist plasma pretreatment process does not etch substantially into the photoresist-underlying layer. For example, it is preferably that no more than 5–25% of the thickness of the photoresist-underlying layer (e.g., the nitride layer) is etched away during the photoresist plasma pretreatment process.

Some of the nitride material etched during the photoresist plasma pretreatment process may be incorporated into the passivation polymer that is deposited along the vertical sidewalls of photoresist feature 108(a). It is believed that the incorporation of the material etched out of the photoresist-underlying layer during the photoresist plasma pretreatment enables the built-up sidewall to better withstand the subsequent photoresist-underlying layer etch. Consequently, the photoresist profile is better maintained since less of the photoresist vertical sidewalls is removed during the subsequent photoresist-underlying layer etch.

Figure 7:
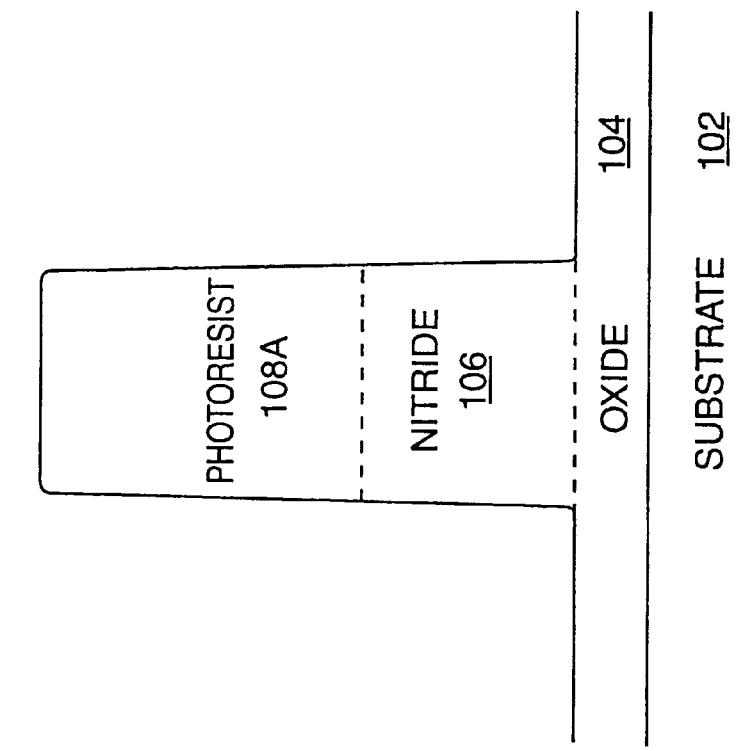
FIG. 7 illustrates the layer stack of FIG. 6 after the nitride etch step.

After plasma treatment of the photoresist mask, the photoresist-underlying layer is etched using a suitable etchant in a plasma etching chamber. In the example of FIG. 7, nitride layer 106 is etched using a conventional fluorine-based plasma using a fluorine-containing source gas. The fluorine-containing source gas may represent, for example, $SF_6$, $He/SF_6$, $SF_6/He/CHF_3$, $SF_6/He/HBr$, $SF_6/O_2$, $CF_4$, $CF_4/He$. Additives such as $CHF_3$ or helium (He) may also be added if desired. In one embodiment, the nitride layer etched is performed in same plasma processing chamber (e.g., the aforementioned 4420XL™) immediately after the plasma treatment step. Advantageously, there is no need to break vacuum lock, and substrate throughput is improved thereby. However, such is not a requirement, and the photoresist-underlying layer etch may be performed in any suitable plasma processing chamber.

As depicted in FIG. 7, the improved profile of photoresist feature 108(a) is transferred, or propagated, down to nitride feature 106(a). Advantageously, profile control of underlying nitride feature 106(a) is advantageously achieved. Note that the improved profile control does not require the increase in the ion bombardment component of the nitride etch step, as was required in the prior art. The improved profile control translates into improved critical dimension (CD) control of the underlying etched nitride feature, thereby rendering the etched nitride feature more suitable for use in fabricating modem high density devices.

Furthermore, it has been found that the photoresist plasma pretreatment also reduces microtrenching. Microtrenching relates to the phenomenon wherein an unintended trench may be formed at the foot of the etched feature or in the open areas due to etch rate microloading (i.e., the phenomenon wherein etching occurs at a faster rate in the open area relative to the dense area). By way of example, microtrenching may cause a small trench to be formed into oxide layer 104 (and possibly into substrate 102 itself) at the foot of etched nitride feature 106(*a*). Although the mechanisms involved in microtrenching have not yet been fully understood, it is believed that a microtrench may be formed when ions from the plasma sheath reflect off the vertical sidewall of the photoresist feature during the etch of the photoresist-underlying layer. With reference to FIG. 4, for example, ions may reflect off the photoresist vertical sidewall in the direction shown by arrow 406.

While not wishing to be bound by theory, it is believed that the reduced microtrenching observed in substrates whose photoresist masks were treated using the inventive process described herein is due, in part, to the reduction in the height of the photoresist feature, which reduces the available vertical surface for the reflecting ions to bounce off. Irrespective of the exact mechanism(s) involved, microtrenching is nevertheless observed to be substantially reduced in substrates whose photoresist masks were treated in advance using the inventive photoresist plasma pretreatment process.

In one exemplary photoresist plasma pretreatment process, an 8-inch silicon wafer having thereon a 100–150 angstroms thick oxide layer disposed under a 1500 angstroms thick nitride layer is employed. The nitride layer is masked with a photoresist mask of about 10,000 angstroms thick. The photoresist mask has therein openings of various witdths, including openings as small as 0.25 micron wide.

The exemplary photoresist plasma pretreatment process takes place in the aforementioned 4420XL™ plasma processing system for about 20 seconds. However, it is contemplated that treatment may last between about 10 seconds to about 60 seconds, and more preferably between about 15 seconds to about 30 seconds in this or another plasma processing system.

The power setting for the exemplary photoresist plasma pretreatment process is about 275 watts (W). However, it is contemplated that the power setting may be between about 100 watts to about 500 watts, and more preferably between about 225 watts to about 400 watts in this or another plasma processing system.

The chamber pressure for the exemplary photoresist plasma pretreatment process is about 425 milliTorr (mT). However, it is contemplated that the chamber pressure may be between about 250 mT to about 700 mT, and more preferably between about 300 mT to about 500 mT in this or another plasma processing system.

The flow rate of the $Cl_2$ gas for the exemplary photoresist plasma pretreatment process is about 200 standard cubic centimeters per minute (sccm). However, it is contemplated that the flow rate of $Cl_2$ may be between about 100 sccm to about 400 sccm, and more preferably between about 150 sccm to about 250 sccm in this or another plasma processing system.

The flow rate of the optional helium gas for the exemplary photoresist plasma pretreatment process is about 400 standard cubic centimeters per minute (sccm). However, it is contemplated that the flow rate of optional helium gas may be between about 0 sccm to about 500 sccm, and more preferably between about 300 sccm to about 500 sccm in this or another plasma processing system. In a different system and/or on when a different substrate size is involved, the flow rates may vary. However, it is contemplated that the disclosed ratios of these gases are suitable for plasma treatment of photoresist masks in a suitable plasma processing system.

The gap setting for the exemplary photoresist plasma pretreatment process is about 0.8 centimeters (cm). However, it is contemplated that the gap setting may be between about 0.6 cm to about 1.2 cm, and more preferably between about 0.7 cm to about 1.0 cm in this or another plasma processing system.

The helium cooling pressure for the exemplary photoresist plasma pretreatment process is about 6 Torr (T). However, it is contemplated that the helium cooling pressure may be between about 0 T to about 12 T, and more preferably between about 0 T to about 10 T in this or another plasma processing system.

The chuck temperature setting for the exemplary photoresist plasma pretreatment process is about 40° C. However, it is contemplated that the chuck temperature setting may be between about 10° C. to about 65° C., and more preferably between about 20° C. to about 50° C. in this or another plasma processing system.

Figure 8:
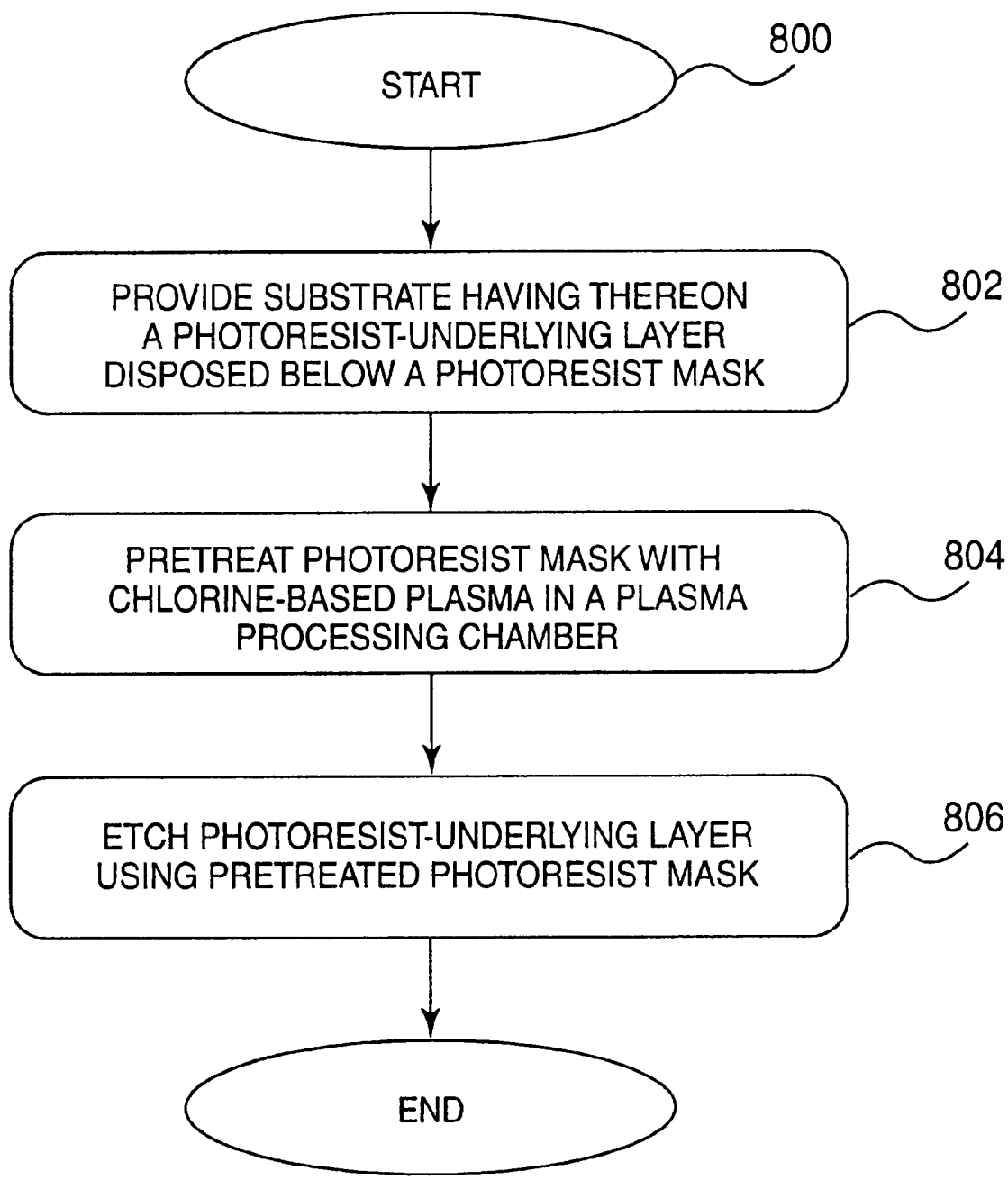
FIG. 8 depicts, in accordance with a one embodiment of the present invention, the steps employed in an exemplary photoresist plasma pretreatment process configured to improve profile control and/or critical dimension control.

FIG. 8 depicts, in accordance with a one embodiment of the present invention, the steps employed in an exemplary photoresist plasma pretreatment process configured to improve profile control and/or critical dimension control. In step 802, a substrate having thereon a photoresist-underlying layer to be etched is provided. The photoresist-underlying layer is disposed below a patterned photoresist mask. In one example, the photoresist-underlying layer represents a nitride layer overlying a thin oxide layer (e.g., nitride layer 106 and oxide layer 104 of FIG. 1). In step 804, the photoresist mask is treated using a chlorine-based plasma to etch at least a portion of the photoresist features and to deposit passivation polymer on vertical sidewalls of the photoresist mask. In step 806, the photoresist-underlying layer is etched using a suitable etchant. For etching the nitride layer, a fluorine-based etchant may be employed as mentioned earlier. Thereafter, the substrate may undergo additional conventional processing steps to form the desired semiconductor-based devices, e.g., flat panel displays, integrated circuits (such as dynamic random access memory circuits, or any other transistor-based circuits).

While this invention has been described in terms of several preferred embodiments, there are alterations, permutations, and equivalents which fall within the scope of this invention. By way of example, although some exemplary process parameter ranges are given for the 4420XL™ plasma processing system, these values may be varied as required when another plasma processing system is involved by those skilled in the art after reading the present disclosure. As a further example, some layer stacks may employ an antireflective coating (ARC) or bottom antireflective coating (BARC) layer (which may be organic or inorganic) below the photoresist layer for photolithography purposes. The ARC or BARC layer may already be patterned or unpatterned prior to photoresist plasma pretreatment. It should also be noted that there are many alternative ways of implementing the methods and apparatuses of the present invention. It is therefore intended that the following appended claims be interpreted as including all such alterations, permutations, and equivalents as fall within the true spirit and scope of the present invention.

What is claimed is:

1. A method for etching a nitride photoresist-underlying layer, the method comprising the steps of:
   providing a substrate having thereon a nitride photoresist-underlying layer and a photoresist mask overlying said photoresist-underlying layer;
   treating, using a chlorine-based plasma, said photoresist mask in a plasma processing chamber, said treating being configured to etch at least a portion of said photoresist mask and to deposit passivation polymer on vertical sidewalls of said photoresist mask, said chlorine-based plasma being generated from an etchant source gas, said etchant source gas consisting essentially of a member of the group consisting of $Cl_2$, $Cl_2$/He, $Cl_2$/HBr, $Cl_2$/HBr/He, and $Cl_2$/$N_2$; and
   after said treating, etching said photoresist-underlying layer in a subsequent etching process using said photoresist mask.

2. The method of claim 1 wherein said treating step is configured to improve a vertical profile of a photoresist feature of said photoresist mask.

3. The method of claim 2 wherein said nitride photoresist-underlying layer is formed on a silicon-based substrate.

4. The method of claim 3 wherein said treating step further includes the steps of:
   forming said chlorine-based plasma using said etchant source gas by supplying radio-frequency (RF) energy to said plasma processing chamber; and
   etching said photoresist layer with said chlorine-based plasma for a predefined period of time.

5. The method of claim 3 wherein said step of etching said photoresist-underlying layer further includes etching with a fluorine-based plasma.

6. The method of claim 5 wherein said etching step further includes the step of forming said fluorine-based plasma from a second etchant source gas that includes one of $SF_6$, $SF_6$/He, $SF_6$/He/$CHF_3$, $CF_4$, He/$SF_6$/HBr, and He/$CF_4$.

7. The method of claim 1 wherein said treating step further includes the steps of:
   forming said chlorine-based plasma using said etchant source gas by supplying radio-frequency (RF) energy to said plasma processing chamber; and
   etching said photoresist layer with said chlorine-based plasma for a predefined period of time.

8. A method for improving profile control of during an etch of a nitride photoresist-underlying layer disposed above a substrate, the photoresist-underlying layer being disposed below a photoresist mask, the method comprising the steps of:
   positioning said substrate, including said photoresist-underlying layer and said photoresist mask, in a plasma processing chamber;
   flowing a chlorine-containing etchant source gas into said plasma processing chamber, said chlorine-containing etchant source gas consisting essentially of a member of the group consisting of $Cl_2$, $Cl_2$/He, $Cl_2$/HBr, $Cl_2$/HBr/He, and $Cl_2$/$N_2$;
   igniting a plasma out of said chlorine-containing etchant source gas to form a chlorine-based plasma within said plasma processing chamber;
   treating, using a chlorine-based plasma, said photoresist mask in said plasma processing chamber, said treating being configured to etch at least a portion of said photoresist mask and to deposit passivation polymer on vertical sidewalls of said photoresist mask without etching through said photoresist-underlying layer.

9. The method of claim 8 applied to a photoresist-underlying layer directly below said photoresist mask and in direct contact with said photoresist mask.

10. The method of claim 8 further including the step of etching, subsequent to said step of treating said photoresist mask, said photoresist-underlying layer using said photoresist mask, said step of etching said photoresist-underlying layer being performed with a plasma different from said chlorine-based plasma.

11. The method of claim 10 wherein said steps of treating said photoresist mask and etching said photoresist-underlying layer are both performed in said plasma processing chamber.

12. The method of claim 2 wherein said nitride photoresist-underlying layer is formed on a silicon-based substrate.

13. The method of claim 12 further including the step of etching said photoresist-underlying layer, subsequent to said treating said photoresist mask, using said photoresist mask, wherein said etching said photoresist-underlying layer includes etching with a fluorine-based plasma.

14. The method of claim 13 wherein said etching step further includes the step of forming said fluorine-based plasma from a second etchant source gas that includes one of $SF_6$, $SF_6$/He, $SF_6$/He/$CHF_3$, $CF_4$, He/$SF_6$/HBr, and He/$CF_4$.

15. The method of claim 8 wherein said treating step further includes selecting an etching period of time and etching said photoresist layer with said chlorine-based plasma for said period of time.

16. A method for improving profile control of during an etch of a nitride layer disposed above a silicon substrate, the nitride layer being disposed below a photoresist mask, comprising:
   positioning said substrate, including said nitride layer and said photoresist mask, in a plasma processing chamber;
   flowing a chlorine-containing etchant source gas into said plasma processing chamber, said chlorine-containing etchant source gas consisting essentially of a member of the group consisting of $Cl_2$, $Cl_2$/He, $Cl_2$/HBr, $Cl_2$/HBr/He, and $Cl_2$/$N_2$;
   igniting a plasma out of said chlorine-containing etchant source gas to form a chlorine-based plasma within said plasma processing chamber;
   treating, using a chlorine-based plasma, said photoresist mask in said plasma processing chamber, said treating being configured to etch at least a portion of said photoresist mask and to deposit passivation polymer including at least some material etched from said nitride layer on vertical sidewalls of said photoresist mask without etching through said nitride layer.

17. The method of claim 16 further including the step of etching, subsequent to said treating said photoresist mask, said nitride layer using said photoresist mask, said etching said nitride layer being performed with a plasma different from said chlorine-based plasma.

18. The method of claim 17 wherein said steps of treating said photoresist mask and etching said nitride layer are both performed in said plasma processing chamber.

19. The method of claim 18 wherein said plasma processing chamber is one of an inductively coupled plasma processing chamber and a parallel plate plasma processing chamber.

* * * * *